US006894350B2

(12) United States Patent
Shimizu et al.

(10) Patent No.: US 6,894,350 B2
(45) Date of Patent: May 17, 2005

(54) LDMOS TRANSISTOR CAPABLE OF ATTAINING HIGH WITHSTAND VOLTAGE WITH LOW ON-RESISTANCE AND HAVING A STRUCTURE SUITABLE FOR INCORPORATION WITH OTHER MOS TRANSISTORS

(75) Inventors: Akira Shimizu, Tokyo (JP); Takaaki Negoro, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/897,089

(22) Filed: Jul. 23, 2004

(65) Prior Publication Data

US 2005/0017297 A1 Jan. 27, 2005

(30) Foreign Application Priority Data

Jul. 25, 2003 (JP) ........................................ 2003-201672

(51) Int. Cl.[7] .................... H01L 29/76; H01L 29/94; H01L 31/062; H01L 31/113; H01L 31/119
(52) U.S. Cl. ...................... 257/343; 257/346; 257/387; 257/389; 257/396
(58) Field of Search ......................... 257/343, 346, 257/369, 372, 387, 389, 396

(56) References Cited

U.S. PATENT DOCUMENTS 4,190,850 A * 2/1980 Tihanyi et al. ............... 257/343

6,001,677 A 12/1999 Shimizu
6,724,040 B2 * 4/2004 Fujihira ....................... 257/328
2003/0001206 A1 1/2003 Negoro et al.
2004/0150041 A1 * 8/2004 Watanabe et al. ........... 257/343
2004/0207012 A1 * 10/2004 Rumennik et al. .......... 257/343

FOREIGN PATENT DOCUMENTS

| JP | 04-141848 | 6/1992 |
| JP | 06-151351 | 1/1994 |
| JP | 8-97410 | 4/1996 |
| JP | 3226053 | 8/2001 |

* cited by examiner

*Primary Examiner*—Ngan V. Ngo
(74) *Attorney, Agent, or Firm*—Dickstein Shapiro Morin & Oshinsky LLP

(57) ABSTRACT

A semiconductor device, methods for manufacturing the semiconductor device, and an integrated circuit including the semiconductor device are disclosed. The semiconductor device includes an LDMOS transistor and a MOS transistor, both formed simultaneously on a same substrate. The gate electrodes and the gate oxide layers of the LDMOS and the MOS are formed independently from one another. The source and drain regions of the LDMOS and the MOS are respectively formed in a self-aligned manner. In this way, the LDMOS and the MOS can be formed, in an effective manner, while sustaining the respective desired characteristics.

28 Claims, 12 Drawing Sheets

LDMOS TRANSISTOR CAPABLE OF ATTAINING HIGH WITHSTAND VOLTAGE WITH LOW ON-RESISTANCE AND HAVING A STRUCTURE SUITABLE FOR INCORPORATION WITH OTHER MOS TRANSISTORS

CROSS-REFERENCE TO RELATED APPLICATIONS

This application claims priority to Japanese patent application, No. JPAP2003-201672 filed on Jul. 25, 2003, in the Japanese Patent Office, the entire contents of which are incorporated by reference herein.

FIELD OF THE INVENTION

The present invention relates to a semiconductor device, methods for manufacturing the semiconductor device, and an integrated circuit including the semiconductor device, and more particularly, to a semiconductor device incorporating an LDMOS (lateral double-diffused metal oxide semiconductor) transistor, methods for manufacturing a semiconductor device incorporating an LDMOS transistor, and an integrated circuit including a semiconductor device incorporating an LDMOS transistor.

BACKGROUND OF THE INVENTION

Recently, with the widespread use of VLSI (very large scale integration), power control integrated circuits are generally provided with power devices, VLSI logic circuits, memory devices, CPUs (central processing units), etc., which are all fabricated on a single chip. To handle high voltages and currents, DMOS (double-diffused metal oxide semiconductor) transistors are conventionally used for the power devices, which can operate with low on-resistance while attaining high withstand voltage.

LDMOS transistors particularly have a simple structure suitable for incorporation into the VLSI logic circuits, however, they have been considered inferior to VDMOS (vertical double-diffused metal oxide semiconductor) transistors as they have high on-resistance. Recently, RESURF (reduced surface field) LDMOS transistors, capable of providing low on-resistance, are introduced and are increasingly used in the power devices.

FIG. 1 illustrates a section of a background LDMOS transistor, including a substrate 101, a well region 109, a first oxide region 111, a second oxide region 113, a gate oxide region 115, a gate electrode 117, a channel well region 119, a source region 121, and a drain region 123.

The background LDMOS transistor of FIG. 1 is manufactured as follows. First, the well region 109 is diffused in the substrate 101. The oxide regions 111, 113 are formed on the respective surfaces of the well region 109. The gate oxide region 115 is formed over the substrate 101, except for the portion having the oxide layers 111, 113. The gate electrode 117 is formed in between a portion of the well region 109 reserved for the source region 121 and a portion of the well region 109 reserved for the drain region 123, partially covering the portion reserved for the source region 121, and over the gate oxide region 115 and the second oxide region 113. The channel well region 119 is diffused in the well region 109, by implanting and thermally diffusing impurity ions, using one side edge (towards the portion for forming the source region 121) of the gate electrode 117 as a mask. The source region 121 is diffused in the channel well region 119, by implanting and thermally diffusing impurity ions, in the self-aligned manner with respect to the gate electrode 117. The drain region 123 is additionally diffused in the well region 109, between the first and second oxide regions 111, 113 apart from the gate electrode 117, in the self-aligned manner with respect to the second oxide region 113.

One problem of the background LDMOS transistor of FIG. 1 is that the second oxide region 113 interrupts a current flowing from the source region 121 to the drain region 123. This eventually increases on-resistance of the background LDMOS transistor.

To solve this problem, the first and second oxide regions 111, 113 may be eliminated, as illustrated in FIG. 2.

In this case, a resist pattern 125 is additionally provided at the other side edge (towards the drain region 123) of the gate electrode 117 so as to cover a surface of the well region 109 via the gate oxide region 115.

To fabricate the semiconductor device of FIG. 2, the well region 109 is firstly formed in the substrate 101. After depositing the gate oxide region 115, the gate electrode 117 is formed thereon, apart from the drain region 123. The channel well region 119 is diffused in the self-aligned manner with respect to the gate electrode 117. The resist pattern 125 is then formed, and the source region 121 is diffused in the channel well region 119, using the resist pattern 125 as a mask, by implanting impurities, in the self-aligned manner with respect to the gate electrode 117. Subsequently, the drain region 123 is diffused in the well region 109, apart from the gate electrode 117. After formation of the source and drain regions 121 and 123, the resist pattern 125 is removed.

However, the above-described manufacturing method easily causes misalignment of the drain region 123, which is desirably formed apart from the gate electrode 117 for high withstand voltage. To prevent such misalignment, the background LDMOS transistor of FIG. 2 generally has a larger cell size, and suffers from high on-resistance variation. Further, the side edge portion of the gate electrode 117, which is covered by the resist pattern 125, is not implanted with the impurities. That is, a right portion of the gate electrode 117 (See FIG. 2) remains as non-doped and it easily causes the popping phenomenon.

To prevent this popping phenomenon, the gate electrode 117 may be doped before forming the channel well region 119. However, this may cause low withstand voltage.

FIG. 3 illustrates a section of another background LDMOS transistor, when manufactured together with another MOS transistor, particularly, a CMOS (complementary metal oxide semiconductor). During formation of the gate electrode 117, an oxide side wall 127 is usually formed at each side portion of the gate electrode 117. This sometimes causes the source region 121 to form at a position apart from the side portion of the gate electrode 127. Therefore, the source region 121 becomes as an offset region, and causes the LDMOS transistor to be inoperative.

To prevent this problem, a background LDMOS transistor of FIG. 4 further includes a diffused layer 129 of LDD (lightly doped drain) structure, which has a lower impurity concentration than that of the source region 121. However, addition of the diffused layer 129 may increase resistance of the source region 121, thereby increasing on-resistance of the background LDMOS transistor.

Any one of the above-described or other background LDMOS transistors has another problem, when manufactured with other MOS transistors. To attain a high withstand voltage, the channel well region 119 is usually formed with high temperature of about 1100 degrees C. Under such a high temperature, the other MOS transistors may suffer from redistribution of impurity ions that have been implanted in the channel well regions. This may cause the withstand voltage of the other MOS transistors to decrease.

BRIEF SUMMARY OF THE INVENTION

The present invention provides a semiconductor device, including an LDMOS transistor capable of attaining high withstand voltage with low on-resistance, and having a structure suitable for incorporation with other MOS transistors.

In one example, the semiconductor device includes at least one LDMOS transistor (hereinafter, referred to as the "LDMOS") formed on a defined portion of a substrate, and at least one MOS transistor (hereinafter, referred to as the "MOS") formed on another defined portion of the substrate. The LDMOS and the MOS are electrically isolated from each other by a field oxide layer provided therebetween.

The LDMOS mainly includes a channel well region, a first source region, a first drain region, a first gate electrode, a first gate oxide layer, and a mitigation oxide layer. The channel well region is diffused in the defined portion of the substrate, for example, by ion implantation and thermal diffusion. The first source region is diffused in the channel well region, for example, by ion implantation and thermal diffusion. The first gate electrode is formed on the substrate, between the source region and the drain region, specifically at a position substantially near the source region and spatially separated from the drain region. The first gate oxide layer is formed on the substrate, under a bottom surface of the first gate electrode. The mitigation oxide layer is formed on the substrate, between the first source region and the first drain region, closely contacting a part of the bottom surface of the first gate electrode, and having a thickness larger than a thickness of the first gate oxide layer.

Additionally, the LDMOS may include a first well region, a drain well region in the first well region, and a first diffused region in the channel well region. The first well region may include therein the channel well region and the first drain region. The drain well may include therein the first drain region. The first diffused region may closely contact the first gate electrode via the first gate oxide layer, while being adjacent to the first source region.

The MOS mainly includes a second source region, a second drain region, a second gate electrode, and a second gate oxide layer. The second source region is diffused in the defined portion in the substrate. The second drain region is diffused in the substrate, apart from the source region. The second gate electrode is formed on the substrate, between the second source region and the second drain region. The second gate oxide layer is formed on the substrate, under a bottom surface of the second gate electrode.

Additionally, the MOS may include a second diffused region, apart from the second source region and the second drain region, respectively. Further, the MOS may include a second well region so as to incorporate therein the second source region and the second drain region. Furthermore, the MOS may include a third source region in the second source region, and a third drain region in the second drain region. In this case, the third source region has a low impurity concentration than that of the second source region, while the third drain region has a low impurity concentration than that of the second drain region.

With the above-described structure, both the LDMOS and the MOS, which are incorporated in the semiconductor device, can operate in an effective manner, while sustaining their respective desired characteristics.

In one example, the mitigation oxide layer is not diffused in a portion between the source region and the drain region. Thus, a current flows from the source region to the drain region without being interrupted, thereby lowering on-resistance of the LDMOS.

In another example, the mitigation oxide layer may have a cross-sectional shape of nearly trapezoid, to increase stability of the LDMOS.

In another example, the second gate electrode is formed apart from the second source region and the second drain region, respectively, thereby lowering on-resistance of the MOS.

In another example, the first diffused layer may be provided as mentioned above, to secure operability of the LDMOS.

The above components may be fabricated as follows, for example.

In a first step, the mitigation oxide layer is deposited on the substrate and patterned into the predetermined shape, for example, by using at least one of the techniques, including thermal diffusion, CVD, photolithography, dry etching, and wet etching.

In a second step, the first gate oxide layer is deposited on the substrate, except for the portion having the mitigation oxide layer.

In a third step, the first gate electrode, preferably made of polysilicon, is produced on the first gate oxide layer such that its bottom edge surface closely contacts a surface portion of the mitigation oxide layer, and it has an opening nearly in a center of the first region. In this step, at least one of the techniques, including photolithography, CVD, etching, is preferably used.

In a fourth step, the channel well region is formed in a portion corresponding to the opening of the first gate electrode, in a self-aligned manner with respect to another bottom edge surface of the first gate electrode. In this step, at least one of the techniques, including photolithography, ion implantation, and thermal diffusion, is preferably used.

In a fifth step, the first gate oxide layer is removed from the substrate except for the portion underlying the first gate electrode.

In a sixth step, the oxide layer is deposited on the substrate, except for the portion having the first gate oxide layer.

In a seventh step, an oxide resistance layer is deposited in a portion including the first region and the second region, for example, by using at least one of the techniques, including CVD, photolithography, and etching.

In an eighth step, the field oxide layer is formed in a portion including a portion between the first region and the second region, by the LOCOS method, for example.

In a ninth step, the first oxide layer and the oxide resistant layer are removed from the substrate.

In a tenth step, an oxide layer is formed on a top surface and a side surface of the first gate electrode, for example, by thermal diffusion.

In an eleventh step, the second gate oxide layer is formed, for example, by thermal diffusion simultaneously with the tenth step.

In a twelfth step, impurities are implanted in the channel well region, for example, according to the desired threshold voltage of the semiconductor device.

In a thirteenth step, the first source region is diffused in the channel well region, in a self-aligned manner with respect to the first gate electrode.

In a fourteenth step, the first drain region is formed in a portion apart from the first source region, in a self-aligned manner with respect to the mitigation oxide layer.

In a fifteenth step, the second source region is formed at one side of the second gate electrode, and the second drain region is formed at another side of the second gate electrode.

In a sixteenth step, impurities are implanted into the first gate electrode.

With the above exemplary manufacturing method, the LDMOS and the MOS, which are incorporated in the semiconductor device, can operate in an effective manner, while sustaining their respective desired characteristics.

In one example, the first source region and the first drain region are formed, respectively, in a self-aligned manner with respect to the first gate electrode and the mitigation oxide layer. Further, the channel well region is formed in a self-aligned manner with respect to the first gate electrode. Thus, the first source region, the first drain region, and the first channel well regions may be easily formed in respective desired positions, thereby promoting miniaturization of the cell size, while securing the effective channel width.

In another example, the first gate oxide layer and the second gate oxide layer are formed independently from each other. Further, the first gate electrode and the second gate electrode are formed independently from each other. Furthermore, the field oxide layer and the mitigation oxide layer are formed independently from each other. Thus, each of the above-mentioned components may be formed with a desired thickness, according to the desired characteristics of the semiconductor device, including on-resistance, withstand voltage, etc.

In an alternative to the above exemplary method, a side wall region may be additionally formed. In such a case, the second gate electrode is kept on the first region, when the second gate electrode is patterned in the second region in the eleventh step. The third source region and the third drain regions are then formed, respectively, in a self-aligned manner with respect to the side wall region. The second gate electrode remained on the first region is then removed. In this way, the semiconductor device may be formed without having a side wall region provided in the first region.

In another example, the channel well region is thermally diffused in the twelfth step, before forming the second source and drain regions in the fifteenth step or before implanting the first gate electrode in the sixteenth step. In this way, redistribution of the channel well region is prevented.

In addition to the above-described steps, various other steps may be applied together with the above-described steps, as will be apparent to those skilled in the art. For example, a step of forming a channel stopper layer may be provided, preferably after the twelfth step of implanting the channel well region.

The above-described semiconductor device may be applied to various forms of integrated circuit. For example, a voltage regulating circuit, which controls a voltage input from a power supply to stably supply a fixed amount of voltage to a load. In such a voltage regulating circuit, an input terminal receives an input voltage from the power supply. A reference voltage generator generates a reference voltage. A resistor receives the input voltage and generates a divided voltage based on the input voltage. An amplifier compares the divided voltage received from the resistor with the reference voltage received from the reference voltage generator, and generates an output voltage based on the comparison. An output driver receives the output voltage, and passes it to an output terminal, which is connected to the load.

In the above exemplary case, each of the reference voltage generator and the amplifier may suitably include the MOS of the present invention. The output driver may suitably include the LDMOS of the present invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
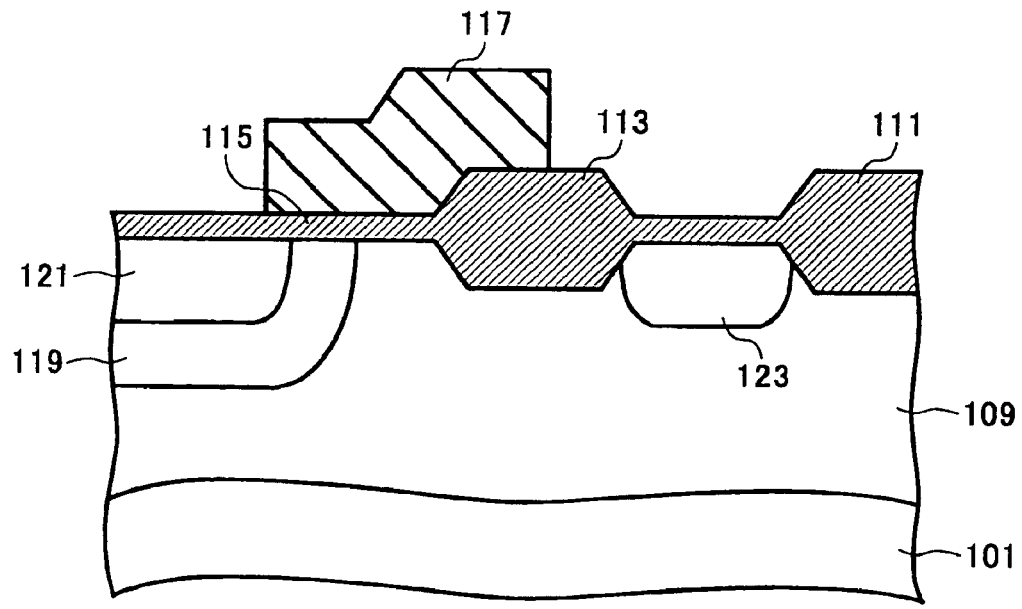
FIG. 1 is a cross-sectional view illustrating a semiconductor device including a background LDMOS transistor.
Figure 2:
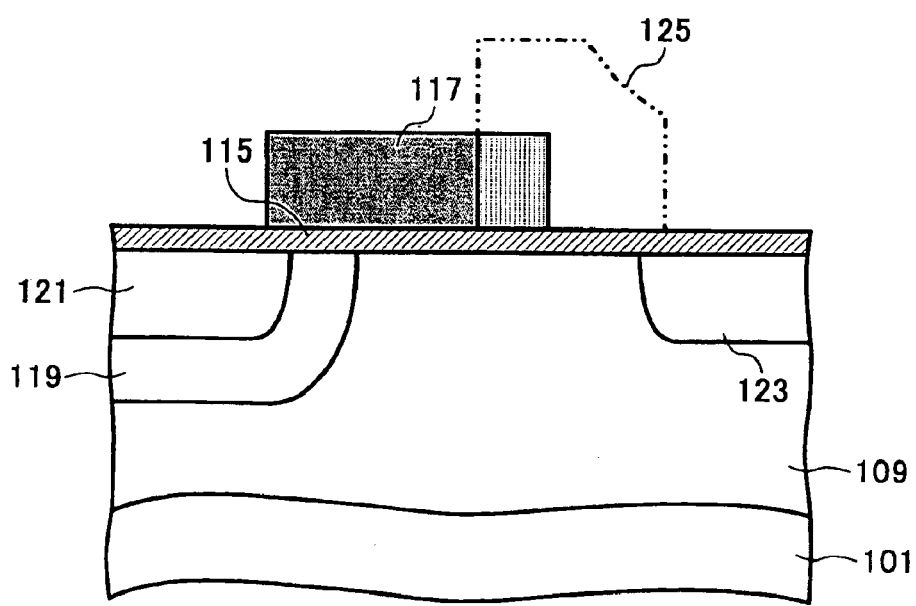
FIG. 2 is a cross-sectional view illustrating a semiconductor device including another background LDMOS transistor.
Figure 3:
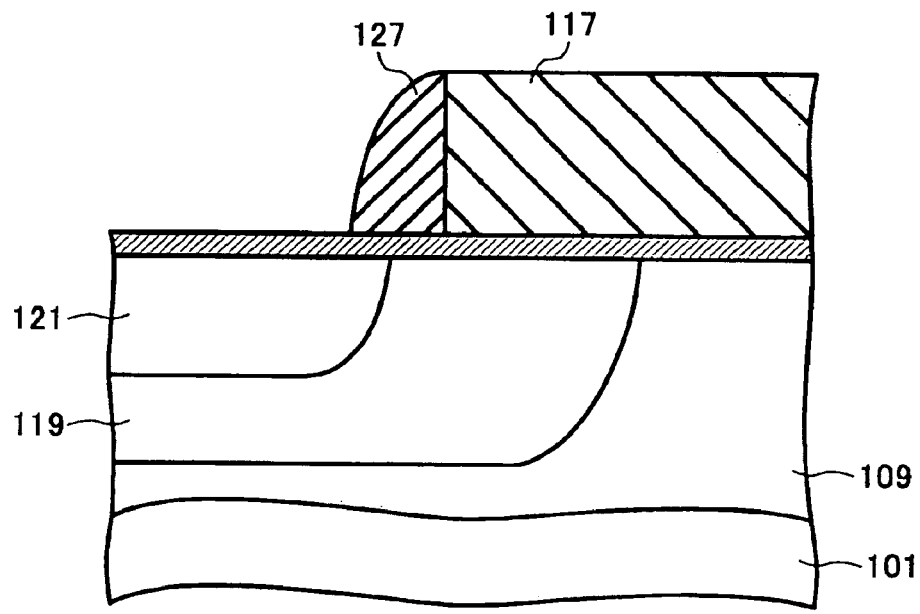
FIG. 3 is a cross-sectional view illustrating a semiconductor device including another background LDMOS transistor.
Figure 4:
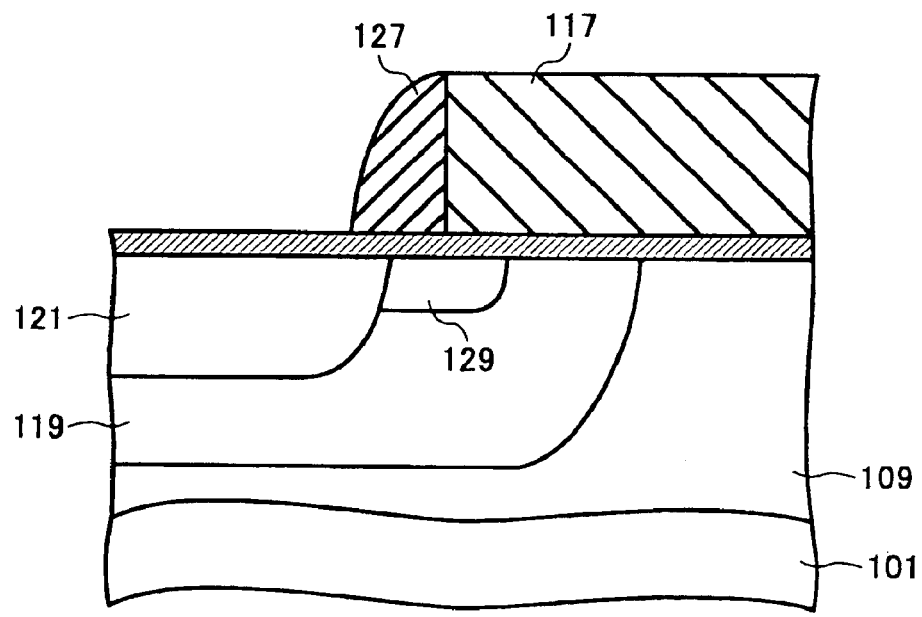
FIG. 4 is a cross-sectional view illustrating a semiconductor device including another background LDMOS transistor.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, preferred embodiments of the present invention are explained.

Figure 5A:
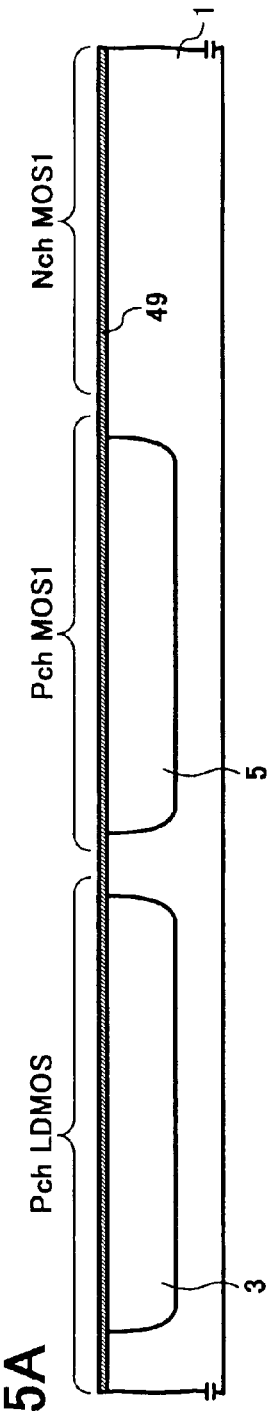
FIGS. 5A to 5I are cross-sectional views illustrating partial steps in a method for manufacturing a semiconductor device in a stepwise manner according to a first preferred embodiment of the present invention.
Figure 5B:
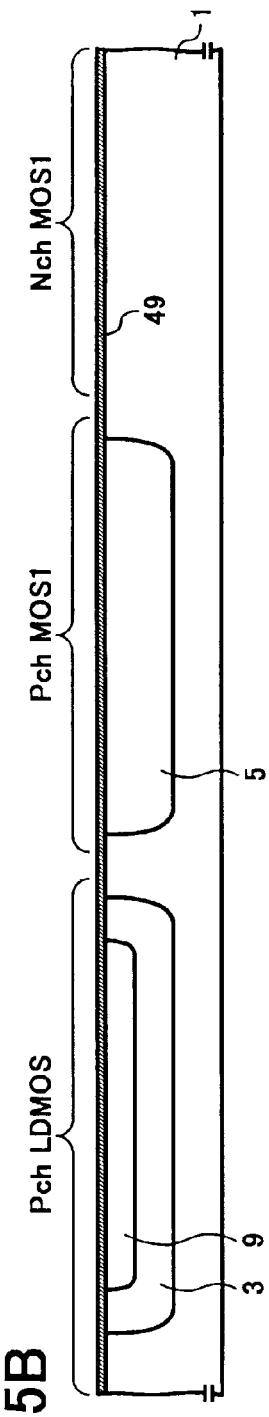
Figure 5C:
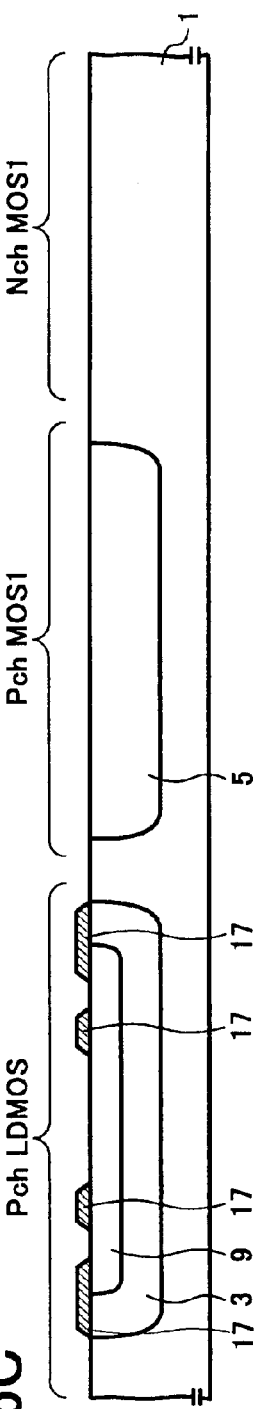
Figure 5D:
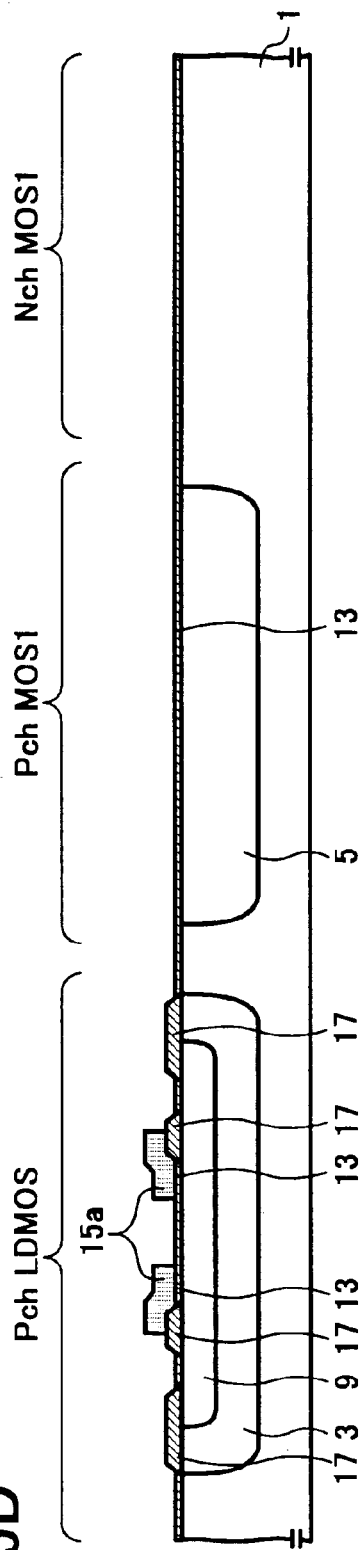
Figure 5E:
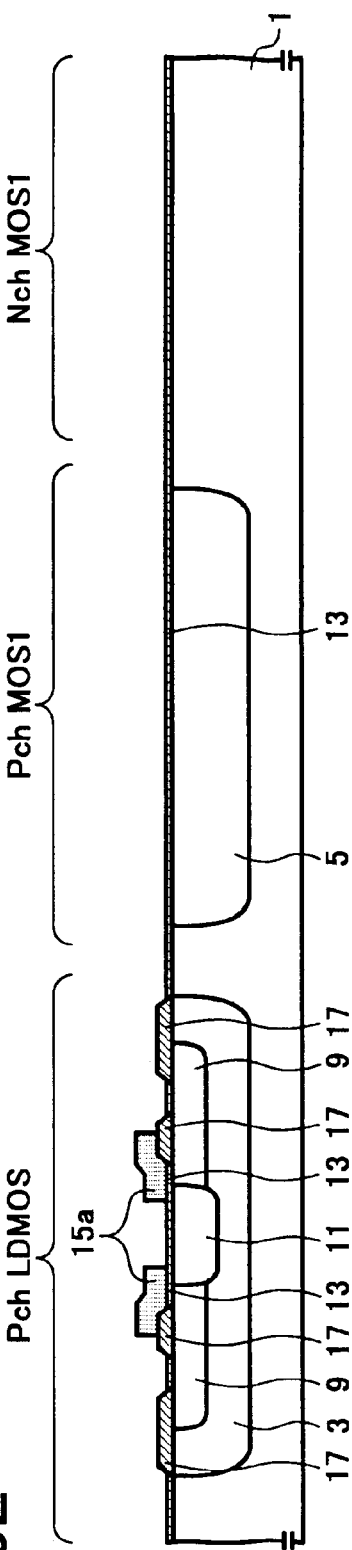
Figure 5F:
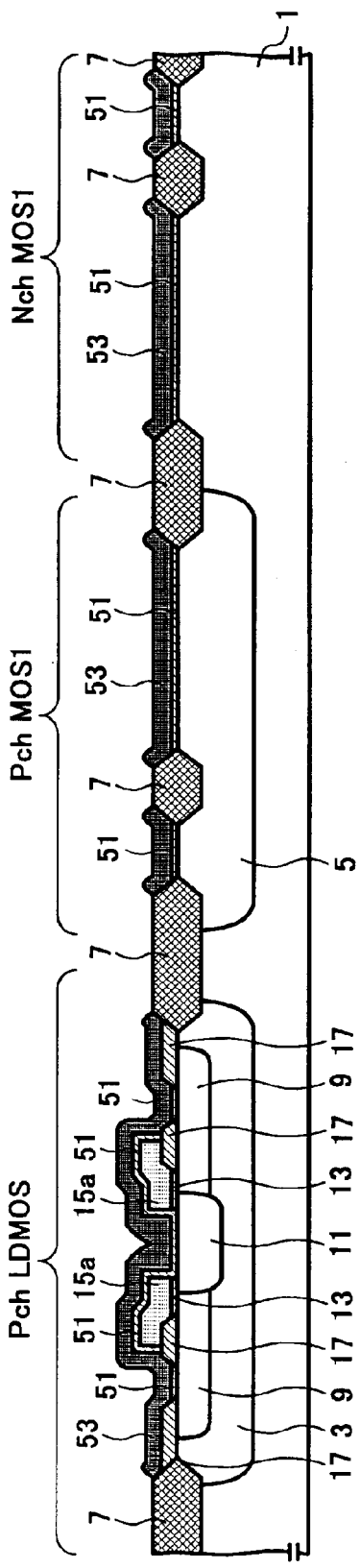
Figure 5G:
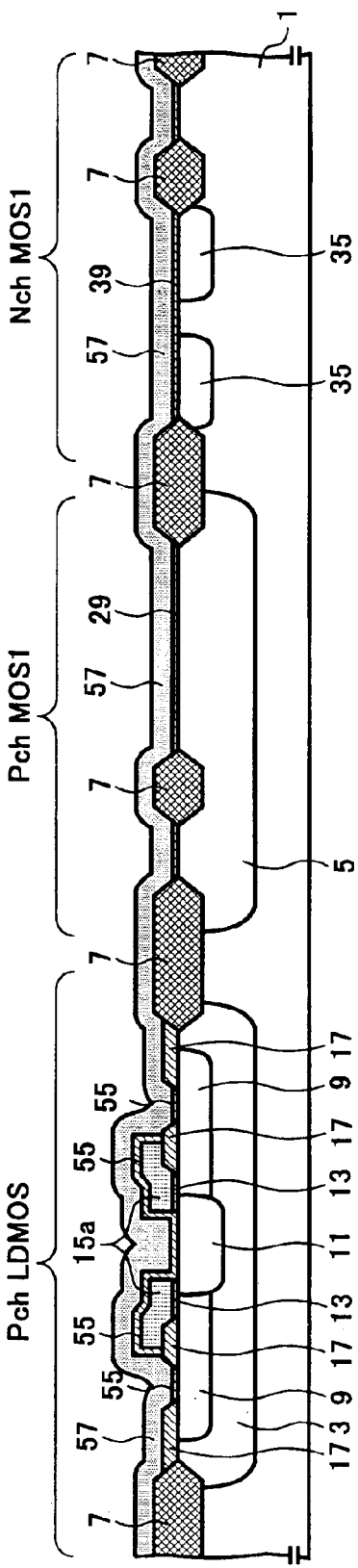
Figure 5H:
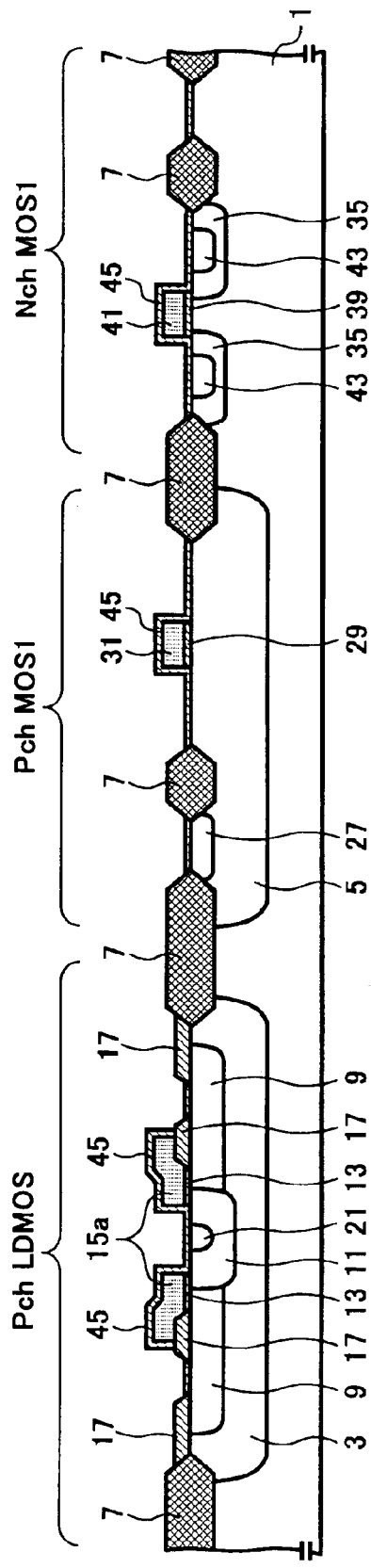
Figure 5I:
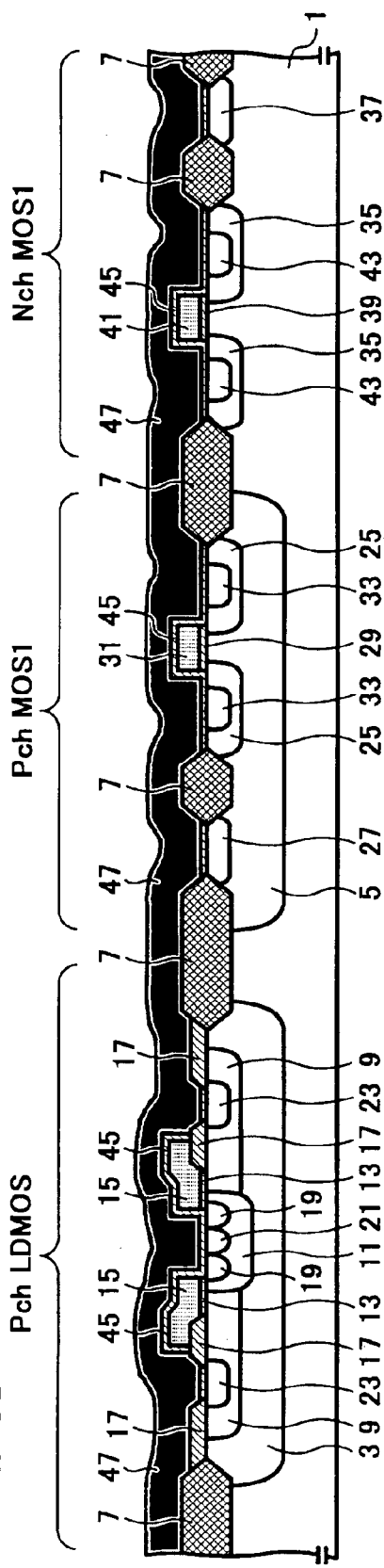

FIG. 5I illustrates a section of a semiconductor device according to an embodiment of the present invention. The semiconductor device of FIG. 5I includes a P-channel LDMOS transistor (hereinafter, referred to as a "PchLDMOS"), and a CMOS transistor provided with a P-channel MOS transistor (hereinafter, referred to as a "PchMOS1") and an N-channel MOS transistor (hereinafter, referred to as an "NchMOS1"), all of which are formed on a P-type substrate 1 and protected by an insulating layer 47. In this example, the PchMOS1 and the NchMOS1 both have LDD structures, in which source regions and drain regions are formed respectively by using resist patterns. The PchLDMOS, PchMOS1, and NchMOS1 are electrically separated from one another by a field oxide layer 7. Further, another channel stopper layer (not shown) may be additionally provided for such separation.

The PchLDMOS includes a first N-type well region (well region) 3, a P-type drain well region (drain well region) 9, an N-type channel well region (channel well region) 11, a first gate oxide layer (gate oxide layer) 13, a first P-type gate electrode (gate electrode) 15, a field mitigation oxide layer (oxide layer) 17, a P-type source region (source region) 19, a first N-type diffused layer (diffused layer) 21, a P-type drain region (drain region) 23, and a thermal oxide layer (oxide layer) 45.

The PchMOS1 includes a second N-type well region (well region) 5, a first P-type low concentration source/drain region (source/drain region) 25, a second N-type diffused layer (diffused layer) 27, a second gate oxide layer (gate oxide layer) 29, a first N-type gate electrode (gate electrode) 31, a first P-type high concentration source/drain region (source/drain region) 33, and the thermal oxide layer (oxide layer) 45.

The NchMOS1 includes a first N-type low concentration source/drain region (source/drain region) 35, a first P-type diffused layer (diffused layer) 37, a third gate oxide layer (gate oxide layer) 39, a second N-type gate electrode (gate electrode) 41, a first N-type high concentration source/drain region (source/drain region) 43, and the thermal oxide layer (oxide layer) 45.

Now, an exemplary structure of the PchLDMOS is explained.

The well region 3, formed in the substrate 1, includes the drain well region 9, having a diffusion depth shallower than that of the well region 3. In the drain well region 9, the channel well region 11, having a diffusion depth deeper than that of the drain well region 9, is formed. In other words, the channel well region 11, formed in the well region 3, divides the drain well region 9 into two parts.

The oxide layer 17 and the gate oxide layer 13 are both formed on the respective surfaces of the substrate 1, covering the well region 3.

The oxide layer 17 has a thickness greater than that of the gate oxide layer 13, and further has a cross-sectional shape of nearly trapezoid. As shown, the oxide layer 17 has a 4-part structure, with two parts formed adjacent to the field oxide layer 7 at the both ends of the PchLDMOS, and the other two parts formed in intermediate between these two parts and the surface of the channel well region 11.

The gate electrode 15 is provided on the substrate 1, with the gate oxide layer 13 formed underneath, except for a portion contacting the oxide layer 17. The gate electrode 15 has a 2-part structure corresponding to the structure of the oxide layer 17. Each part of the gate electrode 15 covers a portion of the respective part of the oxide layer 17, extends toward the surface of the channel well region 11 until it reaches a surface portion of the source region 19. Further, the gate electrode 15 is protected by the thermal oxide layer 45, which covers the top and side surfaces of the gate electrode 15.

The channel well region 11 includes therein the source region 19 having a 2-part structure, with each formed at a portion close to the respective part of the gate electrode 15. Additionally, the diffused layer 21 is formed nearly at the center of the channel well region 11, between the two parts of the source region 19.

In the drain well region 9, the drain region 23 is formed, having a 2-part structure. Each part of the drain region 23 is positioned between the respective parts of the oxide layer 17, apart from the respective part of the gate electrode 15.

Next, an exemplary structure of the PchMOS1 is explained.

The well region 5, formed in the substrate 1, includes the source/drain region 25, the diffused layer 27, and the source/drain region 33.

The source/drain region 25 is made of 2 parts, one functioning as a source and the other functioning as a drain. As shown, these two parts are formed apart from each other in a portion toward one end of the PchMOS1. The source/drain region 33 is also made of 2 parts, one functioning as a source and the other functioning as a drain. These two parts are formed within the respective parts of the source/drain region 25. The source/drain region 25 has a diffusion depth deeper than that of the source/drain region 33.

The diffused layer 27 is formed in a portion toward the other end of the PchMOS1, apart from the source/drain region 25.

Further, the field oxide layer 7 and the gate electrode 31 are provided on the substrate 1.

In addition to the field oxide layer 7 provided at the both ends of the PchMOS1, which isolates the PchMOS1 from the PchLDMOS and the NchMOS1, another part of the field oxide layer 7 is provided so as to isolate the diffused layer 27 from the portion having the source/drain region 25 and the source/drain region 33.

The gate electrode 31 is formed on the substrate 1, with the gate oxide layer 29 provided underneath, in a portion interposed between the two parts of the source/drain region 25. As shown, the gate electrode 31 and the gate oxide layer 29 partially cover the surfaces of the source/drain region 25. The gate electrode 31 is protected by the thermal oxide layer 45, covering the top and side surfaces of the gate electrode 31.

The NchMOS1 is substantially similar in structure to the PchMOS1. Specifically, the source/drain region 35, 43, the gate oxide layer 39, the gate electrode 41, and the diffused layer 37 correspond to the source/drain region 25, the source drain region 33, the gate oxide layer 29, the gate electrode 31, and the diffused layer 27, respectively. However, the diffused layer 37 is provided on the opposite end of the NchMOS1 compared to the case of the PchMOS.

Next, a method for manufacturing the semiconductor device of FIG. 5I is explained with reference to FIGS. 5A to 5I.

In a step illustrated in FIG. 5A, a thermal oxide layer 49 is formed on the substrate 1 with a thickness of about 25 nm.

Next, a resist pattern (not shown) is formed on the thermal oxide layer 49 using photolithography, which defines the portions for forming the well regions 3 and 5, respectively.

To form the well regions 3 and 5, phosphorus ions, which serve as N-type impurities, are implanted into the substrate 1, using the resist pattern as a mask, under the conditions of an acceleration energy of about 150 keV and a dose of about $5.0 \times 10^{12}$ atoms/cm2. After removing the resist pattern, the implanted phosphorus ions are thermally diffused at about 1150 degrees C. As a result, the well regions 3 and 5, each having a diffusion depth of 5 to 7 nm, with an impurity concentration of about 1.0 times 1016 atoms/cm2 at the surface, are simultaneously formed.

Here, the diffusion depth and the impurity concentration are optimally defined depending on the characteristics of the semiconductor device, such as its withstand voltage, threshold voltage, or on-resistance. Further, the well regions 3 and 5 may be formed at different times from each other.

In a step illustrated in FIG. 5B, another resist pattern (not shown) is formed using photolithography, which defines the portion for forming the drain well region 9. In this example, boron ions, which serve as positive impurities, are implanted into the substrate 1, using the resist pattern as a mask, under the conditions of an acceleration energy of about 50 KeV and a dose of about 1.0 times 1013 to 5.0 times 1013 atoms/cm2. After removing the resist pattern, the implanted boron ions are thermally diffused at about 1000 degrees C. so as to form the drain well region 9.

In a step illustrated in FIG. 5C, the oxide layer 17, having a thickness of about 250 nm, is formed on the surface of the substrate 1. The oxide layer 17 may be formed by thermal diffusion, simultaneously with formation of the drain well region 9 in the previous step, or may be formed independently by CVD (chemical vapor deposition). The oxide layer 17 is then patterned, using a resist pattern (not shown) as a mask, through dry etching or wet etching. In this example, wet etching using hydrofluoric acid is preferably applied since it makes a cross-sectional shape of the oxide layer 17 nearly trapezoid. This trapezoid shape reduces a stress on the gate electrode 15 to be formed, and further provides stability to the semiconductor device.

Again, the thickness of the oxide layer 17 is optimally defined depending on the characteristics of the semiconductor device.

In a step illustrated in FIG. 5D, the gate oxide layer 13 of approximately 25 nm in thickness is formed on the surface of the substrate 1, except for the surface having the oxide layer 17 thereon.

Subsequently, a polysilicon layer is formed on the gate oxide layer 13 by CVD, and patterned by photolithography and etching to form a gate preform 15a, which is a non-doped preform of the gate electrode 15. In this example, the gate preform 15a has a thickness of 400 nm, however, it may be optimally defined depending on the characteristics of the semiconductor device.

In a step illustrated in FIG. 5E, a resist pattern (not shown) is formed, having an opening corresponding to the portion for forming the channel well region 11. Using this resist pattern as a mask, the channel well region 11 is formed by implanting phosphorous ions into the substrate 1, under the conditions of an acceleration energy of about 100 KeV and a dose of about 3.0 times 1013 to 7.0 times 1013 atoms/cm2. After removing the resist pattern, the implanted phosphorous ions are thermally diffused at about 1100 degrees C. for approximately 2 hours. However, the amount and the time of ion implantation, i.e., the diffusion depth and the impurity concentration of the channel well region 11, depend on the characteristics of the semiconductor device. Further, by this step, the channel well region 11 is formed in the self-aligned manner with respect to the inner side walls of the gate preform 15a.

In a step illustrated in FIG. 5F, the gate oxide layer 13 is removed from the substrate 1 except for a portion underlying the gate preform 15a.

Subsequently, a buffer oxide layer 51 of about 25 nm in thickness is formed, by thermal diffusion, on the surface of the substrate 1, including the surface of the gate preform 15a, except for the portion having the oxide layer 17 and the portion reserved for the field oxide layer 7.

Further, an oxide resistant layer 53, preferably made of nitride silicon, is deposited on the buffer oxide layer 51 by CVD. The oxide resistant layer 53 is then patterned by photolithography and etching, corresponding to the respective active regions of the PchLDMOS, the PchMOS1 and the NchMOS1.

Next, the substrate 1 is heated at approximately 1000 degrees C., so as to form the field oxide layer 7 by the LOCOS (local oxidation of silicon) method with a thickness of approximately 800 nm. In this case, the surface not covered by the oxide resistant layer 53 is subjected to the LOCOS so as to form the field oxide layer 7 thereon. With formation of the field oxide layer 7, the PchLDMOS, the PchMOS1, and the NchMOS1 can be isolated from one another.

In this case, impurities, as the channel stoppers (not shown), may be implanted into predetermined portions of the substrate 1 and the well region 3, before the LOCOS application.

In a step illustrated in FIG. 5G, the oxide resistant layer 53 and the buffer oxide layer 51 are removed.

Subsequently, the gate oxide layers 29 and 39 are formed, by thermal oxidation, to each have a thickness of approximately 40 nm. With this thermal oxidation, another thermal oxide layer 55 of 40 nm in thickness is formed on the surface of the gate preform 15a. The thickness of the oxide layers 29, 39, or 55 is defined depending on the characteristics of the semiconductor device, such as the snapback or the withstand voltage of the CMOS.

Next, the source/drain region 35 is formed on the semiconductor substrate 1, by implanting phosphorus ions under the conditions of an acceleration energy of about 100 KeV and a dose of about 5.0 times 1012 to 10.0 times 1012 atoms/cm2. The implanted phosphorus ions are then thermally diffused at about 1000 degrees C.

At this time, the channel well region 11 is subjected to channel doping, so as to effectively control the threshold voltages of the PchMOS and the NchMOS, respectively.

Next, a polysilicon layer 57 is deposited on the substrate 1 with a thickness of about 300 nm, and thermally diffused with impurities to raise its conductivity. In this example, the polysilicon layer 57 is thermally diffused with phosphorus ions to have a resistance of approximately 30 ohm/cm2.

In a step illustrated in FIG. 5H, the polysilicon layer 57 is patterned using photolithography and etching, to form the gate electrode 31 and the gate electrode 41, respectively. At this time, the polysilicon layer 57 is removed from the PchLDMOS, however, the thermal oxide layer 55 acts as an etching stopper to protect the gate preform 15a from being etched.

Subsequently, hydrofluoric acid is applied to remove the gate oxide layer 29 except for the portion below the gate electrode region 31, the gate oxide layer 39 except for the portion below the gate electrode region 41, and the thermal oxide layer 55.

Using photolithography, another resist pattern is formed, having openings corresponding to the portions reserved for the source region 21, the diffused layer 27, and the source/drain region 43. To form the source region 21, the diffused layer 27, and the source/drain region 43, arsenic ions are implanted, using this resist pattern as a mask, under the conditions of an acceleration energy of about 50 KeV and a dose of 6.0 times 1015 atoms/cm2. The implanted arsenic ions are then thermally diffused at about 950 degrees C.

At the same time, the thermal oxide layer 45 of about 20 nm in thickness is formed on the substrate 1, including the surfaces of the gate preform 15a, the gate electrode 31, the gate electrode 41, the source region 21, the diffused layer 27, and the source/drain region 43.

By this step, formation of the NchMOS1 is completed.

In a step illustrated in FIG. 5I, the source/drain region 25 is formed by photolithography and ion implantation, specifically by implanting boron ions into the well region 5 under the conditions of an acceleration energy of about 20 KeV and a dose of about 6.0 times 1012 atoms/cm2. In this example, the source/drain region 25 has a P-type impurity concentration, lower than that of the source/drain region 33.

Subsequently, the source/drain region 33, the diffused layer 37, the diffused layer 19, and the drain region 23 are formed by photolithography and ion implantation, specifically by implanting boron ions under the conditions of about 20 KeV and a dose of about 3.0 times 1015 atoms/cm2. By this step, the diffused layer 19 is formed in the self-aligned manner with respect to the side edge of the gate preform 15a. The drain region 23 is formed in the self-aligned manner with respect to the side edge of the oxide layer 17.

At this time, the boron ions are implanted into the gate preform 15a so as to complete formation of the gate electrode 15.

The insulating layer 47, preferably made of BPSG (Borophospho silicate glass), is then deposited onto the substrate 1 by CVD. Subsequently, the substrate 1 is heated at approximately 900 degrees C. to activate the implanted boron ions and reflow the insulating layer 47.

Thereafter, contact holes, wiring, and a passivation protective layer are formed using a conventional technique.

Figure 6A:
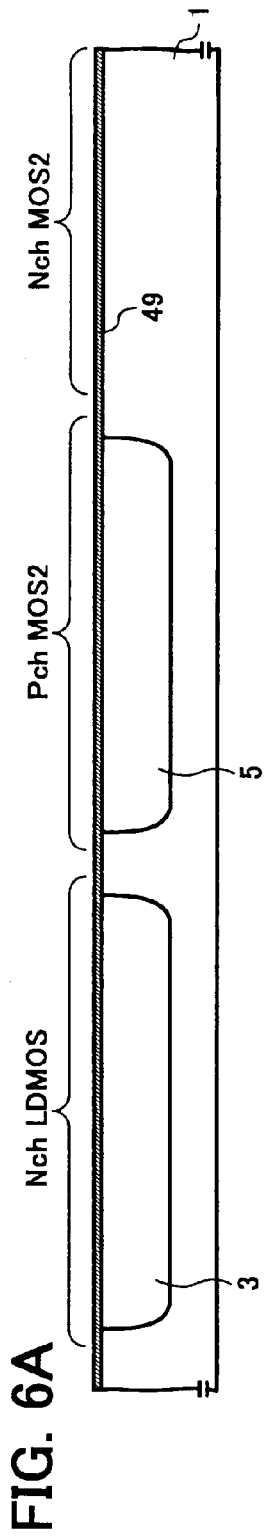
FIGS. 6A to 6I are cross-sectional views illustrating partial steps in a method for manufacturing a semiconductor device in a stepwise manner according to a second embodiment of the present invention.
Figure 6B:
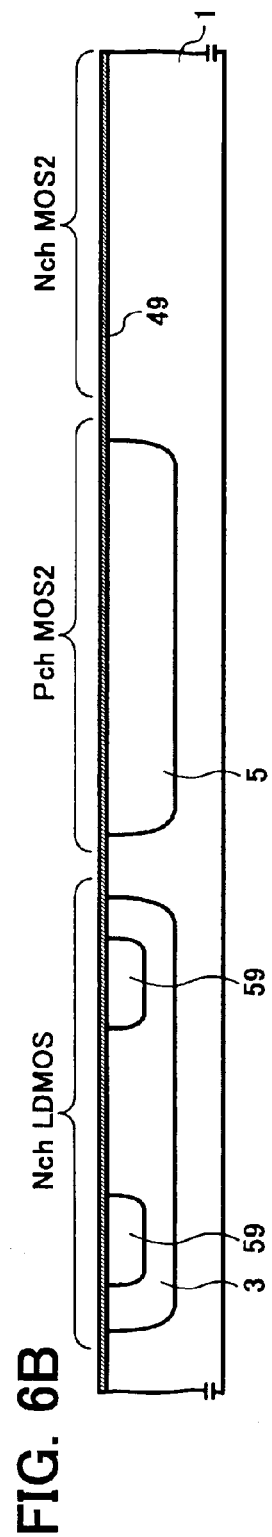
Figure 6C:
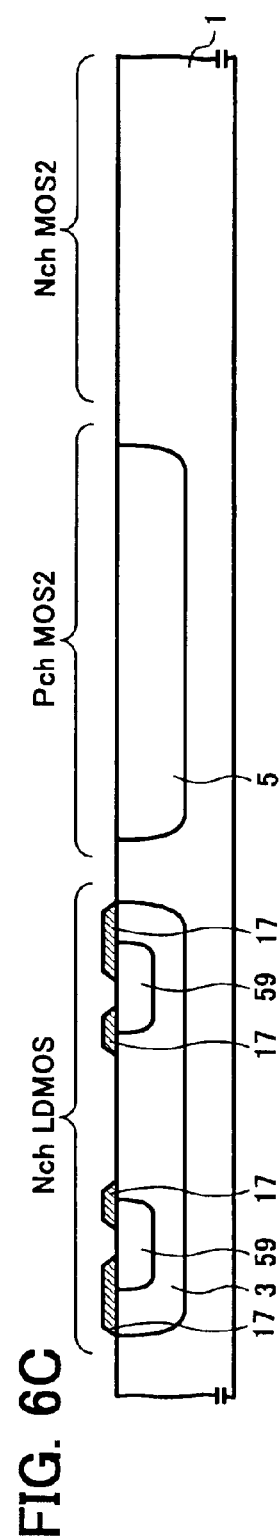
Figure 6D:
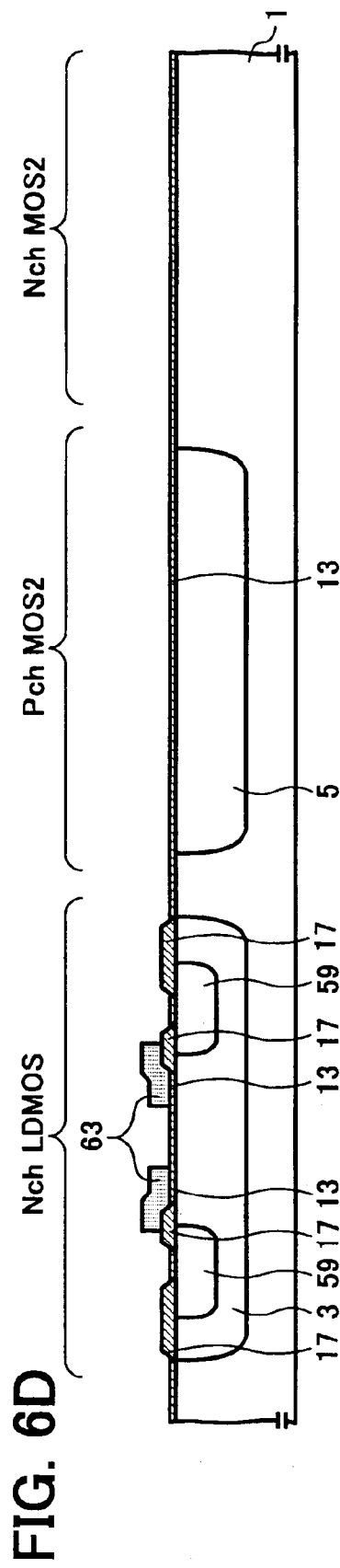
Figure 6E:
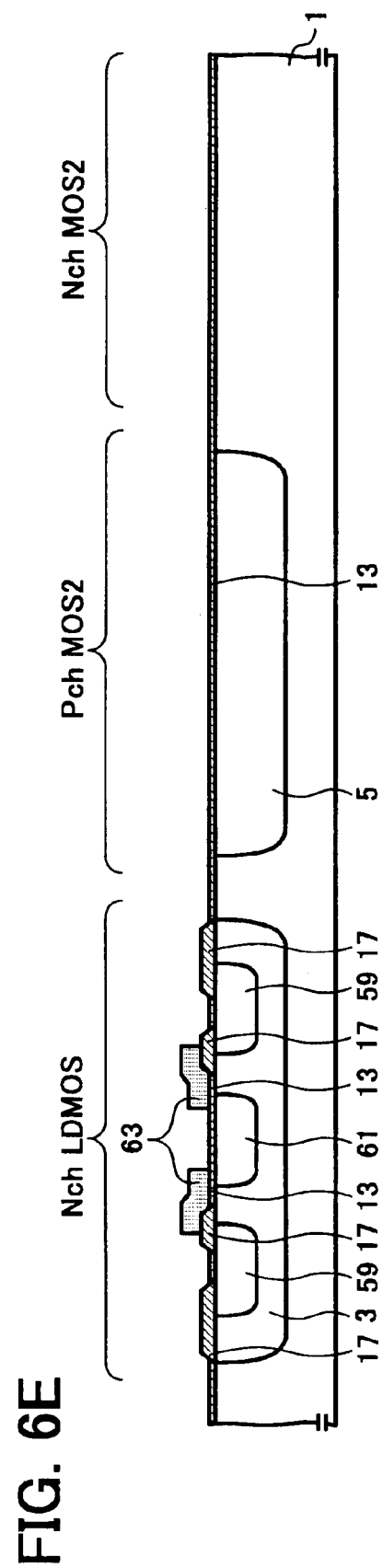
Figure 6F:
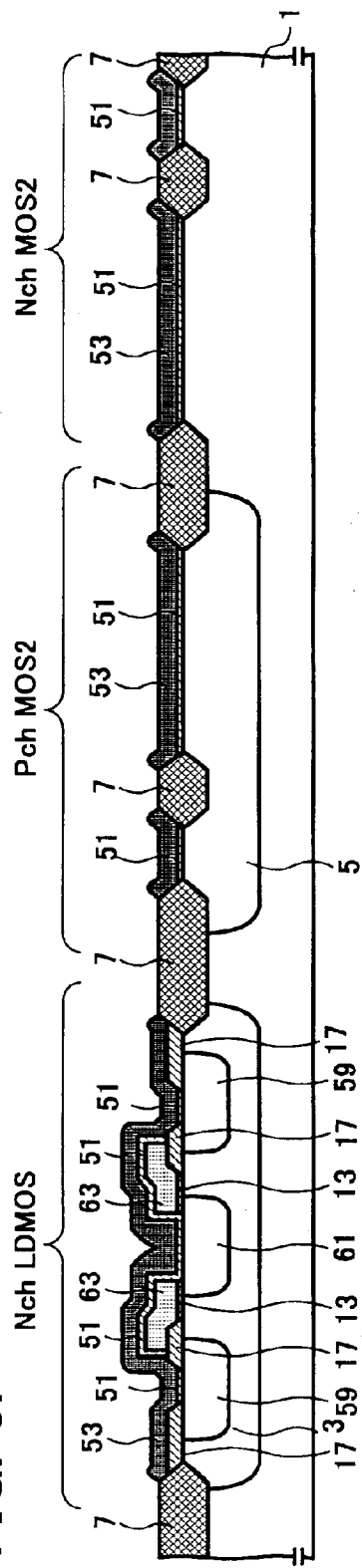
Figure 6G:
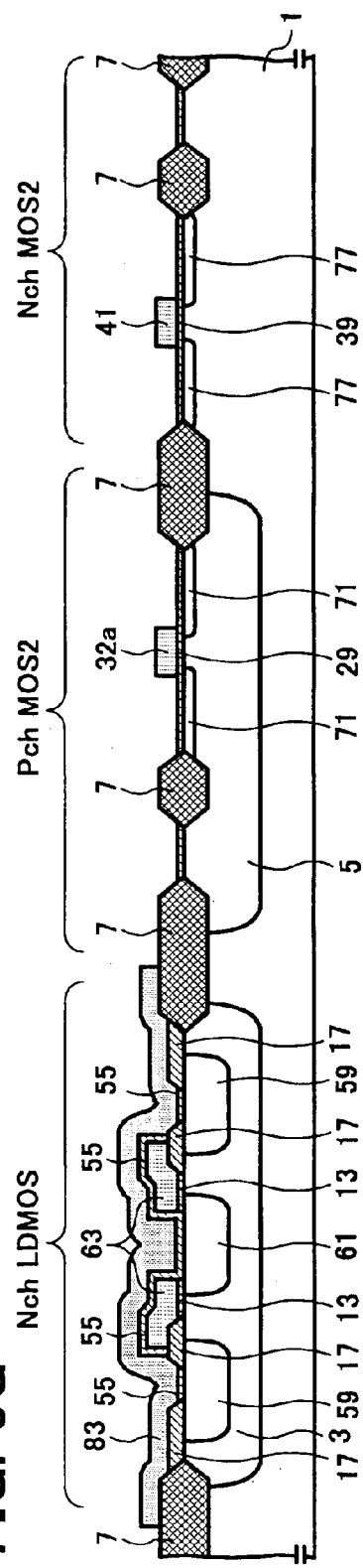
Figure 6H:
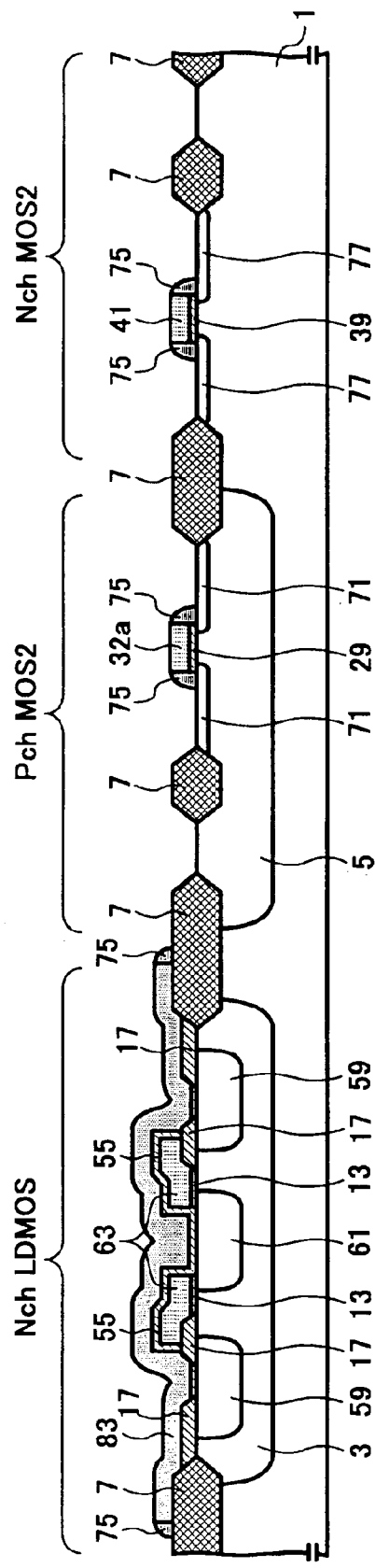
Figure 6I:
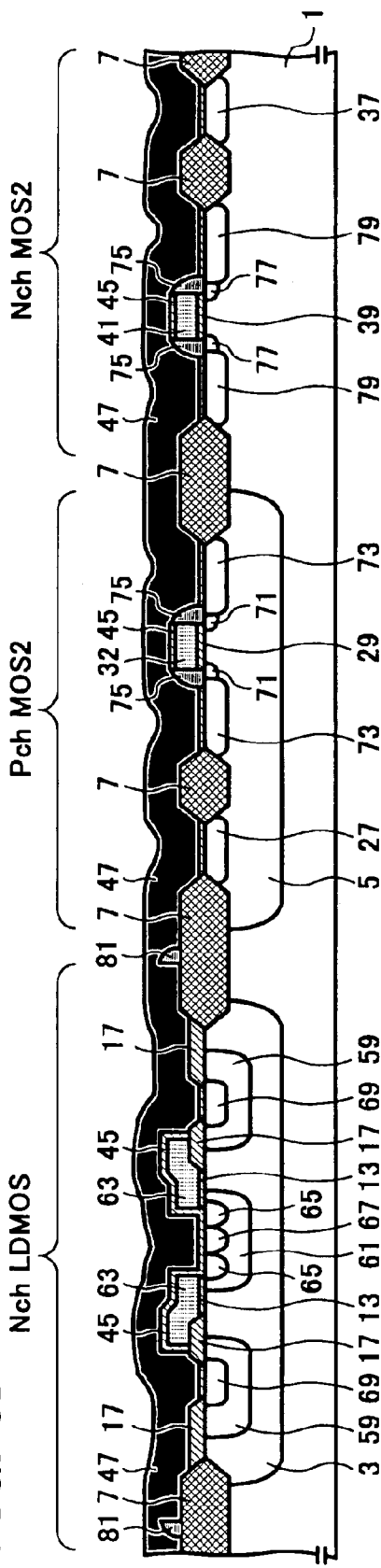

FIG. 6I illustrates a section of a semiconductor device according to another embodiment of the present invention. The semiconductor device of FIG. 6I includes an N-channel LDMOS transistor (hereinafter, referred to as an "NchLDMOS"), and another CMOS transistor provided with another P-channel MOS transistor (hereinafter, referred to as a "PchMOS2") and another N-channel MOS transistor (hereinafter, referred to as a "NchMOS2"), all of which are formed on another P-type substrate 1 and protected by another insulating layer 47. In this example, the PchMOS2 and the NchMOS2 both have LDD structures, in which source regions and drain regions are formed respectively, in the self-aligned manner with respect to a side wall region 75. The NchLDMOS, PchMOS2, and NchMOS2 are electrically separated from one another by another field oxide layer 7. Further, another channel stopper layer (not shown) may be additionally provided for such separation.

In the following description, the components of the semiconductor device of FIG. 6I that are similar in function to those of the semiconductor device of FIG. 5I are designated with same reference numerals and the description thereof are thus abbreviated. It is to be understood that these components of FIG. 6I are not necessarily similar in other aspects, such as material in use, to the components of FIG. 5I.

The NchLDMOS includes the first N-type well region (well region) 3, the first gate oxide layer (gate oxide layer) 13, the field mitigation oxide layer (oxide layer) 17, an N-type drain well region (drain well region) 59, a P-type channel well region (channel well region) 61, a third N-type gate electrode (gate electrode) 63, an N-type source region (source region) 65, a second P-type diffused layer (diffused layer) 67, an N-type drain region (drain region) 69, and the thermal oxide layer (oxide layer) 45.

The PchMOS2 includes the second N-type well region (well region) 5, the second N-type diffused layer (diffused layer) 27, a second P-type gate electrode (gate electrode) 32, the thermal oxide layer (oxide layer) 45, a second P-type low concentration source/drain region (source/drain region) 71, a second P-type high concentration source/drain region (source/drain region) 73, and the side wall region (side wall region) 75.

The NchMOS2 includes the first P-type diffused layer (diffused layer) 37, the third gate oxide layer (gate oxide layer) 39, the second N-type gate electrode (gate electrode) 41, the thermal oxide layer (oxide layer) 45, the side wall region (side wall region) 75, a second N-type low concentration source/drain region (source/drain region) 77, and a second N-type high concentration source/drain region (source/drain region) 79.

The NchLDMOS is substantially similar in structure to the PchLDMOS of FIG. 5I, except for the drain well region 59. Specifically, the channel well region 61, the gate electrode 63, the source region 65, the diffused layer 67, and the drain region 69 correspond to the channel well region 11, the gate electrode 15, the source region 19, the diffused layer 21, and the drain region 23, respectively.

The drain well region 59 has a 2-part structure, with each provided between the field oxide layer 7 and the channel well region 61. Specifically, the distance between the drain well region 59 and the channel well region 61 is defined depending on the characteristics of the semiconductor device, such as the on-resistance of the NchLDMOS. Thus, depending on the on-resistance of the NchLDMOS, the drain well region 59 may be provided so as to closely contact the channel well region 61, eventually providing a structure similar to that of the PchLDMOS of FIG. 5I. Further, depending on the on-resistance of the NchLDMOS, the drain well region 59 may not be provided at all, specifically when the well region 3 has a high impurity concentration.

Now, an exemplary structure of the PchMOS2 is explained.

In the well region 5, the diffused layer 27, the source/drain region 71, and the source/drain region 73 are provided.

The source/drain region 71 is made of 2 parts, one functioning as a source and the other functioning as a drain. As shown, these two parts of the source/drain region 71 are formed apart from each other in a portion toward one end of the PchMOS2. The source/drain region 73 is also made of 2 parts, one functioning as a source and the other functioning as a drain. Each part of the source/drain region 73 closely contacts the outer edge, which is away from the center of the PchMOS2, of the respective part of the source/drain region 71. In this example, the source/drain region 71 is smaller in size than the source/drain region 73.

The gate electrode 32, preferably made of polysilicon, is formed on the substrate 1 via the gate oxide layer 29, in a portion interposed between the two parts of the source/drain region 71. The gate electrode 32 and the gate oxide layer 29 partially cover the surfaces of the source/drain region 71, while they are kept away from the source/drain region 73. The gate electrode 32 is provided with the side wall region 75, which closely contacts the both sides of the gate electrode 32.

The NchMOS2 is substantially similar in structure to the PchMOS2, except that the diffused layer 37 is provided on the opposite end of the NchMOS2 compared to the case of the PchMOS2.

Next, a method for manufacturing the semiconductor device of FIG. 6I is explained with reference to FIG. 6A to 6I.

In a step illustrated in FIG. 6A, the thermal oxide layer 49 is formed on the substrate 1 to have a thickness of about 25 nm. Then, the well regions 3 and 5 are formed in a similar manner as described referring to FIG. 5A.

In a step illustrated in FIG. 6B, a resist pattern (not shown) is formed using photolithography, which defines the portion for forming the drain well region 59. To form the drain well region 59, phosphorus ions, which serve as N-type impurities, are implanted into the substrate 1, using the resist pattern as a mask, under the conditions of an acceleration energy of about 100 KeV and a dose of about 1.0 times 1012 atoms/cm2. After removing the resist pattern, the implanted phosphorus ions are thermally diffused at about 1000 degrees C. so as to form the drain well region 59.

Again, the amount and time of ion implantation is defined depending on the characteristics of the semiconductor device.

In a step illustrated in FIG. 6C, the oxide layer 17, having a thickness of about 150 nm, is formed on the surface of the substrate 1. The oxide layer 17 may be formed by thermal diffusion, simultaneously with formation of the drain well region 59 in the previous step, or may be formed independently by CVD. The oxide layer 17 is then patterned, in a similar manner as described referring to FIG. 5C.

In a step illustrated in FIG. 6D, the gate oxide layer 13 of approximately 25 nm in thickness is formed on the surface of the substrate 1, in a similar manner as described referring to FIG. 5D.

Subsequently, a polysilicon layer is formed on the gate oxide layer 13 by CVD. The polysilicon layer is then subjected to ion implantation or thermal diffusion to raise its conductivity. In this example, phosphorus ions, which serve as N-type impurities, are implanted so as to form the polysilicon layer having a resistance of about 60 ohm/cm2.

Thereafter, the polysilicon layer is patterned into the gate electrode 63 through photolithography and etching.

Further, in this example, the polysilicon layer has a thickness of about 350 nm, however, it is optimally defined depending on the characteristics of the semiconductor device.

In a step illustrated in FIG. 6E, a resist pattern (not shown) is formed, having an opening corresponding to the region for forming the channel well region 61. Using this resist pattern as a mask, the channel well region 61 is formed by implanting boron ions into the substrate 1 under the conditions of an acceleration energy of about 20 KeV and a dose of about 1.0 times 1013 to 5.0 times 1013 atoms/cm2. After removing the resist pattern, the implanted boron ions are thermally diffused at about 1100 degrees C. for approximately 2 hours.

In a step illustrated in FIG. 6F, after removing the gate oxide layer 13, the buffer oxide layer 51 and the oxide resistant layer 53 are formed, respectively, in a similar manner as described referring to FIG. 5F. After implanting the channel stoppers, the filed oxide layer 7, having a thickness of about 500 nm, is formed in a similar manner as described referring to FIG. 5F, by applying a heat of approximately 1000 degrees C. to the oxide layer 17. In this case, channel stopper implantation may be treated as an optional step.

In a step illustrated in FIG. 6G, the oxide resistant layer 53 and the buffer oxide layer 51 are removed.

Subsequently, the gate oxide layers 29 and 39 and the thermal oxide layer 55 are formed, by thermal oxidation, to each have a thickness of about 12 nm, in a similar manner as described referring to FIG. 5G.

At this time, the channel well region 61 is subjected to channel doping so as to adjust the threshold voltages of the PchMOS2 and the NchMOS2, respectively.

Next, a polysilicon layer having a thickness of about 350 nm is deposited on the substrate 1 by CVD, and an oxide layer is formed thereon. Using photolithography and etching, the oxide layer is removed except for the portion corresponding to the active region of the PchMOS2.

Using the remained oxide layer as a mask, the polysilicon layer, except for the portion corresponding to the active region of the PchMOS2, is subjected to thermal diffusion so as to raise its conductivity. In this example, the polysilicon layer is thermally diffused with phosphorus ions to have a resistance of approximately 30 ohm/cm2.

Thereafter, the polysilicon layer is patterned using photolithography and etching, to respectively form a gate preform 32a, which is a preform of the gate electrode 32, on the gate oxide layer 29, and the gate electrode 41 on the gate oxide layer 39. The gate preform 32a is formed of non-doped silicon, for example.

At this time, the polysilicon layer 83 remains only on the surface of the NchLDMOS.

Subsequently, the source/drain region 77 is formed, using a photoresist as a mask, and by implanting phosphorous ions under the conditions of an acceleration energy of about 60 KeV and a dose of 2.0 times 1013 to 4.0 times 1013 atoms/cm2. In this way, the source/drain region 77 is formed in the self-aligned manner with respect to the gate electrode 41.

Similarly, the source/drain region 71 is formed, using a resist pattern as a mask, and by implanting boron ions under the conditions of an acceleration energy of about 30 KeV and a dose of about 2.0 times 1013 to 4.0 times 1013 atoms/cm2. In this way, the source/drain region 71 is formed in the self-aligned manner with respect to the gate preform 32a.

In a step illustrated in FIG. 6H, a silicon oxide layer is deposited on the entire surface of the substrate 1 by CVD. Using anisotropic etching, the side wall region 75 is formed, respectively at the side surfaces of the gate preform 32a and at the side surfaces of the gate electrode 41. In addition, the side wall region 75 is formed on the both sides of the polysilicon layer 83.

In a step illustrated in FIG. 6I, a resist pattern (not shown) is formed on the substrate 1 by photolithography, having an opening corresponding to the portion for forming the polysilicon layer 83. Using this resist pattern as a mask, the polysilicon layer 83 is removed by etching.

At this time, the oxide layer 55 protects the gate electrode 63 from being etched.

In this example, a side wall region 81, corresponding to the side wall region 75, remain even after etching. However, the side wall region 81 does not have any influence on the characteristics of the semiconductor device.

Next, the oxide layer 55 is removed, for example, by using hydrofluoric acid. By photolithography, a resist pattern (not shown) is formed, having an opening corresponding to the portion for forming the diffused layer 27 and the active region of the NchLDMOS. Using this resist pattern as a mask, arsenic ions are implanted under the conditions of an acceleration energy of about 50 KeV and a dose of 6.0 times 1015 atoms/cm2. The implanted arsenic ions are then thermally diffused at about 950 degrees C. to form the diffusion layer 27, the source region 65, the drain region 69 and the source/drain 79.

At the same time, the thermal oxide layer 45 of about 20 nm in thickness is formed on the gate electrode 63, the gate preform 32a, the gate electrode 41, the diffusion layer 27, the source region 65, the drain region 69 and the source/drain 79.

In this way, the source/drain region 79 is formed in the self-aligned manner with respect to the side wall region 75, formed on the gate electrode 41, to complete formation of the NchMOS2.

Thereafter, a resist pattern (not shown) is formed by photolithography, having an opening corresponding to the portion for forming he PchMOS, the diffused layer 37, and the diffused layer 67. Using this resist pattern as a mask, boron ions are implanted under the conditions of an acceleration energy of about 20 KeV and a dose of about 3.0 times 1015 atoms/cm2 to form the gate electrode 73. In this way, the source/drain region 73 is formed in the self-aligned manner with respect to the side wall region 75, formed on the gate electrode 32, to complete formation of the PchMOS.

At this time, boron irons are implanted into the gate preform 32a to complete formation of the PchMOS2.

Next, the insulating layer 47, preferably formed of BPSG, is deposited on the substrate 1 by CVD. The substrate 1 is then heated at approximately 900 degrees C. to activate the implanted boron ions and reflow the insulating layer 47.

Thereafter, contact holes, wiring, and a passivation protective layer are formed using a conventional technique.

The semiconductor device according to at least one of the above-described or other embodiments may be incorporated into an integrated circuit of any structure.

Figure 7:
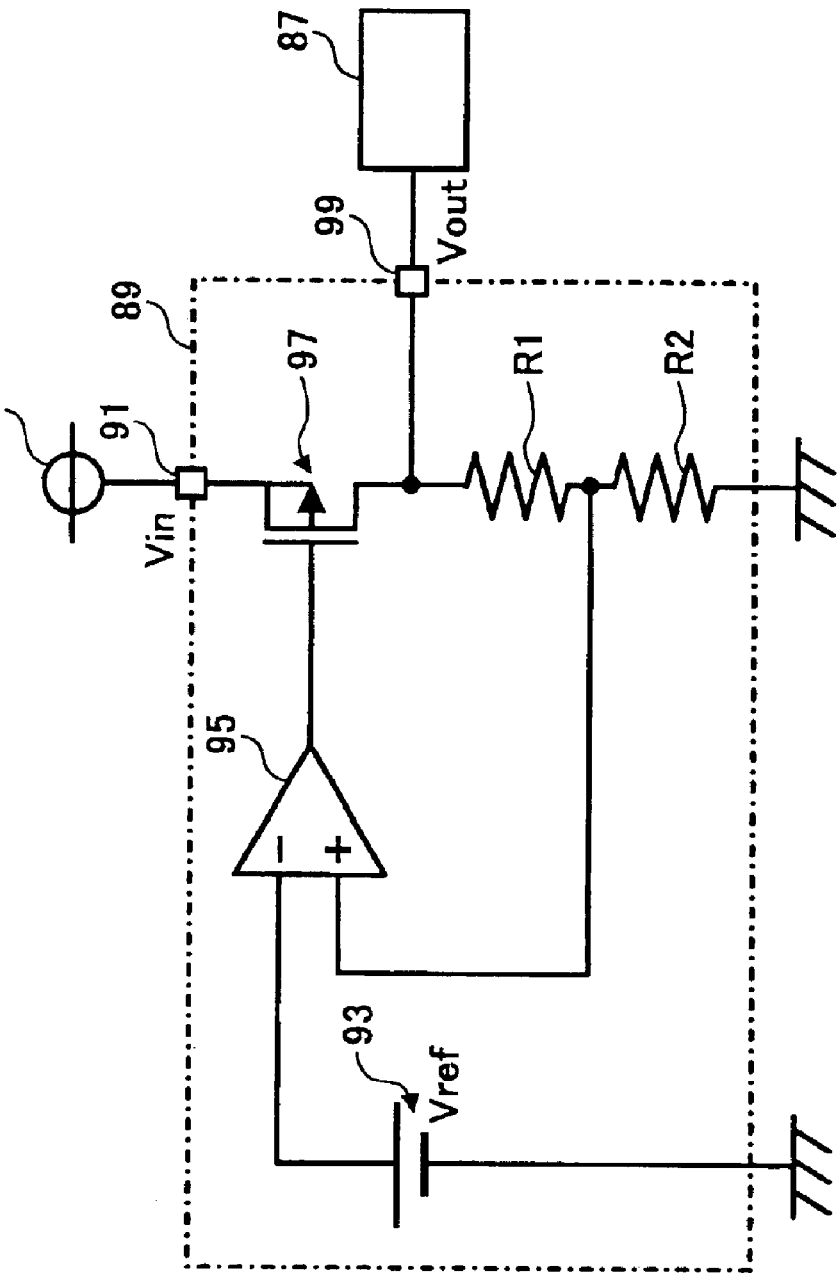
FIG. 7 is a circuit diagram illustrating an integrated circuit including a semiconductor device according to a preferred embodiment of the present invention.

FIG. 7 illustrates an exemplary circuit structure of a voltage regulating circuit 89 incorporating the semiconductor device, manufactured according to one of the embodiments disclosed herein.

The voltage regulating circuit 89 controls a voltage input from a power supply 85 to stably supply a fixed amount of voltage to a load 87.

The voltage regulating circuit 89 includes an input terminal 91, a reference voltage generator 93, an amplifier 95, an output driver 97, resistors R1 and R2, and an output terminal 99.

The input terminal 91, which connects the voltage regulating circuit 89 and the power supply 85, receives a voltage Vin from the power supply 85. The reference voltage generator 93 outputs a reference voltage Vref to the amplifier 95.

The output driver 97 suitably includes the LDMOS disclosed in this patent specification, while the amplifier 95 suitably includes the CMOS disclosed in this patent specification. Further, the reference voltage generator 93 suitably includes the NchMOS disclosed in this patent specification.

The amplifier 95 has a negative input terminal for receiving the reference voltage Vref, a positive input terminal for receiving a divided voltage generated by the resistors R1 and R2, and an output terminal for outputting an output voltage Vout to a gate electrode of the output driver 97. The amplifier 95 controls the divided voltage based on the reference voltage Vref, and outputs it as the output voltage Vout.

Figure 8:
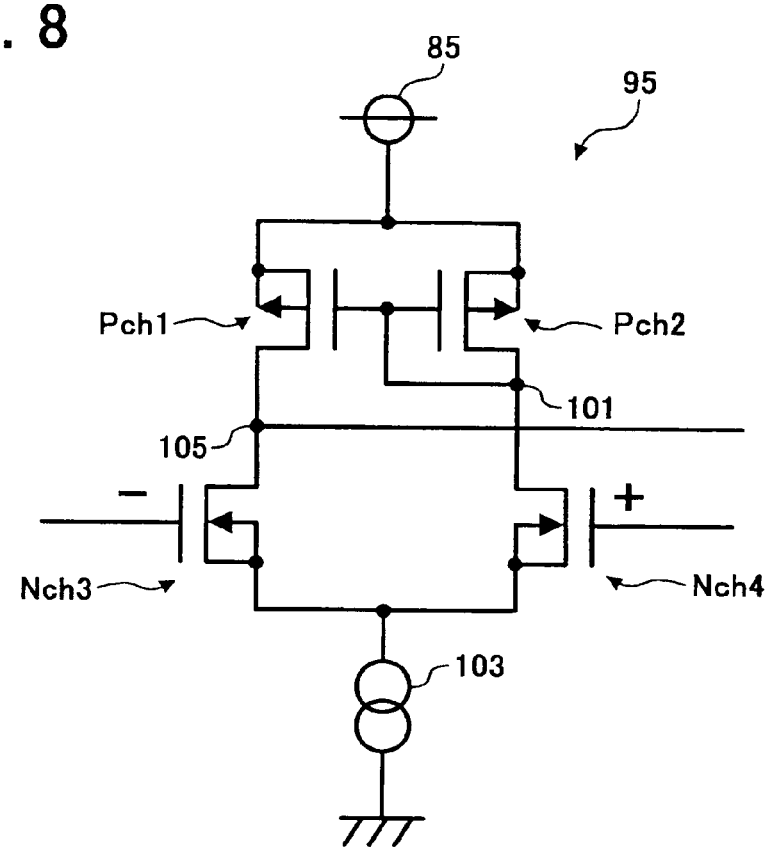
FIG. 8 is a circuit diagram illustrating an exemplary structure of an amplifier included in the semiconductor device shown in FIG. 7.

FIG. 8 illustrates an exemplary circuit structure of the amplifier 95. The amplifier 95 generally includes a pair of NchMOS transistors Nch3 and Nch4 and a pair of PchMOS transistors Pch1 and Pch2. Reference numerals 101, 103, and 105 correspond to connection points.

In this case, the NchMOS disclosed in this specification may be suitably used as the Nch3 or the Nch4, while the PchMOS disclosed in this specification may be suitably used as the Pch1 or the Pch 2.

As shown, the Nch3 and the Nch4 have drains connected to the power supply 85 via the Pch1 and the Pch2, respectively. The Pch1 and the Pch2 have gate electrodes connected to each other, which are further connected to the Nch4, for example, via the connection point 101. Alternatively, the gate electrodes of the Pch1 and the Pch2 may be connected to the Nch3 via another connection point.

In this way, the Pch1 and the Pch2 together function as a current mirror circuit.

The Nch3 includes a gate electrode connected to the negative input terminal of the amplifier 95. The Nch4 has a gate electrode connected to the positive input terminal of the amplifier 95. Sources of the Nch3 and the Nch4 are connected to the ground via the connection point 103. The Nch3 and the Pch1 are connected to the output terminal of the amplifier 95 via the connection point 105.

Next, a general operation of the amplifier 95 is explained.

When a voltage applied to the gate electrode of the Nch4 increases, that is, when a voltage applied to the positive input terminal increases, an amount of the current flowing in the Nch4 increases. This decreases an amount of the voltage at the connection point 101, and further decreases an amount of the voltage applied to the gate electrodes of the Pch1 and Pch2. Thus, an amount of the current flowing through the Pch1, Pch2, and the connection point 105 increases.

Assuming that the negative input terminal has a fixed amount of potential, that is, the Nch3 has a fixed amount of the gate voltage. The Nch3 has a fixed on-resistance value. Thus, the connection point 105 has increased amounts of the current and the voltage. In other words, the increase in the negative input terminal causes the amplifier output to increase.

On the other hand, when a voltage applied to the gate electrode of the Nch4 decreases, that is, when a voltage applied to the positive input terminal increases, an amount of the current flowing in the Nch4 decreases. This increases an amount of the current flowing through the connection point 101, and further increases an amount of the voltage applied to the connection point 101, the Pch1 and the Pch2. Thus, an amount of the current flowing through the Pch1, Pch2, and the connection point 105 decreases. Assuming that the Nch3 has a fixed on-resistance value, the increased current at the connection point 105 causes the voltage to decrease. In other words, the decrease in the negative input terminal causes the amplifier output to decrease.

Figure 9:
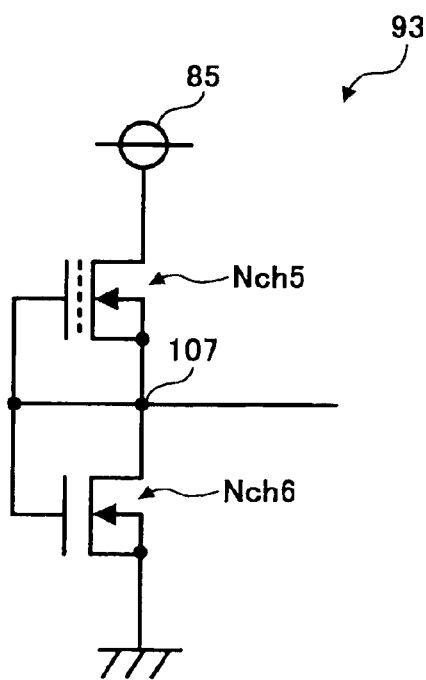
FIG. 9 is a circuit diagram illustrating an integrated circuit including a semiconductor device according to another preferred embodiment of the present invention.

FIG. 9 illustrates an exemplary circuit structure of the reference voltage generator 93 of the voltage regulating circuit 89.

The reference voltage generator 93 includes an N-channel depletion MOS transistor Nch5 and an N-channel enhanced MOS transistor Nch6. The NchMOS disclosed in this specification may be suitably adapted to the Nch5 or the Nch6.

In addition to a drain connected to the power supply 85, the Nch5 has a gate electrode and a source, which are connected to each other at a connection point 107. The Nch5, in this example, functions as a current source supplying a fixed amount of current.

The Nch6 has a gate electrode and a drain, which are connected to each other at the connection point 107. The Nch6 further includes a source connected to the ground. The connection point 107, in this example, functions as an output terminal of the voltage regulating circuit 89.

In this example, the Nch6 operates at a current defined by the Nch5, such that the voltage at the connection position 107, that is, the output of the reference voltage generator 93, is defined depending on the threshold voltage of the Nch6.

The present invention has been described in conjunction with the above exemplary embodiments and it should be noted that this patent specification is not limited to these embodiments and that various modifications and variations may be made without departing from the scope and the spirit of the invention, as will be apparent to those skilled in the art.

In one example, diffusion depths, dimensions, impurity concentrations, impurity materials, etc. for the well regions should be defined, respectively, depending on the desired characteristics of the semiconductor device. In addition, thickness, materials, etc. for the layer regions should be defined, respectively, depending on the desired characterizes of the semiconductor device. For example, the thickness of the oxide layer 17 may be defined, depending on its mitigation characteristic and the on-resistance of the LDMOS. The thickness of the gate electrode 15 may be defined so as to protect the preform 15a from ion implantation. The widths of the channel well region 11 and the source region 19, respectively, may be defined, depending on the effective channel length, which corresponds to the on-resistance of the LDMOS.

In another example, semiconductor substrates of N conductivity type may be alternatively used to form semiconductor devices having components of the opposite conductivity type.

Further, numerous other methods may be applied to form the semiconductor device according to this patent specification, by combining the steps disclosed herein with each other, or substituting the steps disclosed herein for each other, within the scope of the appended claims, as will be apparent to those skilled in the art.

In one example, in the method for forming the semiconductor device according to the second embodiment of the present invention, the gate electrode 63 of the NchLDMOS may be subjected to ion implantation in a step later than the step illustrated in FIG. 6D. However, in the method for forming the semiconductor device according to the first embodiment of the present invention, ion implantation to the gate electrode 15 of the PchLDMOS may not be preferably performed in a step previous to the step illustrated in FIG. 5H, as the boron ions have a relatively large diffusion rate.

What is claimed as new and desired to be protected by Letters Patent of the United States is:

1. A semiconductor device comprising:
a substrate;
an LDMOS (lateral double-diffused metal oxide semiconductor) transistor formed in a first region of the substrate;
a MOS (metal oxide semiconductor) transistor formed in a second region of the substrate; and
a field oxide layer formed in a third region including at least a portion between the first region and the second region, and configured to electrically isolate the first region and the second region,
wherein the LDMOS transistor comprises:
a channel well region formed in the first region;
a first source region formed in the channel well region;
a first drain region formed in the first region, apart from the source region;
a first gate electrode formed over the first region between the source region and the drain region, at a position substantially near the source region and spatially separated from the drain region;
a first gate oxide layer formed on the first region, under a bottom surface of the first gate electrode; and
a mitigation oxide layer formed independently from the field oxide layer, on the first region between the first source region and the first drain region, closely contacting a part of the bottom surface of the first gate electrode, and having a thickness larger than a thickness of the first gate oxide layer, and
wherein the MOS transistor comprises:
a second source region formed in the second region;
a second drain region formed in the second region, apart from the source region;
a second gate electrode formed on the second region, independently from the first gate electrode, between the second source region and the second drain region; and
a second gate oxide layer formed on the second region, independently from the first gate oxide layer, under a bottom surface of the second gate electrode.

2. The semiconductor device of claim 1, wherein the first source region is formed in a self-aligned manner with respect to the first gate electrode.

3. The semiconductor device of claim 1, wherein the first drain region is formed in a self-aligned manner with respect to the mitigation oxide layer.

4. The semiconductor device of claim 1, wherein the channel well region is formed in a self-aligned manner with respect to the first gate electrode.

5. The semiconductor device of claim 1, wherein a thickness of the first gate oxide layer and a thickness of the second gate oxide layer are different from each other.

6. The semiconductor device of claim 5, wherein the thickness of the first gate oxide layer is determined based on characteristics of the LDMOS transistor, and the thickness of the second gate oxide layer is determined based on characteristics of the MOS transistor.

7. The semiconductor device of claim 1, wherein a thickness of the first gate electrode and a thickness of the second gate electrode are different from each other.

8. The semiconductor device of claim 7, wherein the thickness of the first gate electrode is determined based on characteristics of the LDMOS transistor, and the thickness of the second gate electrode is determined based on characteristics of the MOS transistor.

9. The semiconductor device of claim 1, wherein a thickness of the field oxide layer and the thickness of the mitigation oxide layer are different from each other.

10. The semiconductor device of claim 1, wherein the mitigation oxide layer is not diffused in a portion between the source region and the drain region.

11. The semiconductor device of claim 1, wherein the mitigation oxide layer has a substantially trapezoid cross-sectional shape.

12. The semiconductor device of claim 1, wherein the second gate electrode is spatially separated from the second source region and the second drain region, respectively.

13. The semiconductor device of claim 1, wherein the LDMOS transistor further comprises a first well region formed in the first region and configured to incorporate therein the channel well region and the first drain region.

14. The semiconductor device of claim 13, wherein the first well region includes a diffusion depth and an impurity concentration, that are determined based on characteristics of the LDMOS transistor.

15. The semiconductor device of claim 13, wherein the LDMOS transistor further comprises a drain well region in the first well region and configured to incorporate therein the first drain region.

16. The semiconductor device of claim 15, wherein the channel well region has a diffusion depth deeper than a diffusion depth of the drain well region.

17. The semiconductor device of claim 16, wherein a distance between the drain well region and the channel well region is determined based on characteristics of the LDMOS transistor.

18. The semiconductor device of claim 1, wherein the LDMOS transistor further comprises a first diffused region in the channel well region, adjacent to the first source region and closely contacting the first gate electrode via the first gate oxide layer.

19. The semiconductor device of claim 1, wherein the MOS transistor further comprises a second diffused region formed in the second region, apart from the second source region and the second drain region, respectively.

20. The semiconductor device of claim 1, wherein the MOS transistor further comprises a second well region formed in the second region and configured to incorporate therein the second source region and the second drain region.

21. The semiconductor device of claim 1, wherein the MOS transistor further comprises a third source region in the second source region, and a third drain region in the second drain region,
wherein the third source region has a low impurity concentration than an impurity concentration of the second source region, and the third drain region has a low impurity concentration than an impurity concentration of the second drain region.

22. The semiconductor device of claim 1, further comprising a side wall region formed in a portion other than the first region of the substrate.

23. The semiconductor device of claim 22, wherein the portion includes both sides of the second gate electrode.

24. The semiconductor device of claim 1, further comprising a thermal oxide layer covering the first region, the second region, and the third region.

25. An integrated circuit, comprising:
a substrate; and
a voltage regulating circuit formed on the substrate,
wherein the voltage regulating circuit comprises:
an input terminal connected to a power supply and configured to receive a voltage from the power supply;
a reference voltage generator, including at least one MOS transistor, configured to generate a reference voltage;
a resistor configured to divide the input voltage into a divided voltage;
an amplifier, including at least one MOS transistor, connected to the reference voltage generator and the resistor, and configured to generate an output voltage based on the comparison between the divided voltage and the reference voltage;
an output driver, including at least one LDMOS transistor, connected to the amplifier and configured to output the output voltage; and
an output terminal configured to output the output voltage to the outside,
wherein the at least one LDMOS transistor includes:
a channel well region;
a first source region formed in the channel well region;
a first drain region formed apart from the source region;
a first gate electrode formed between the source region and the drain region, at a position substantially near the source region and spatially separated from the drain region;
a first gate oxide layer formed under a bottom surface of the first gate electrode; and
a mitigation oxide layer formed independently from the field oxide layer, between the first source region and the first drain region, closely contacting a part of the bottom surface of the first gate electrode, and having a thickness larger than a thickness of the first gate oxide layer, and
wherein the MOS transistor includes:
a second source region;
a second drain region formed apart from the source region;
a second gate electrode formed independently from the first gate electrode, between the source region and the drain region; and
a second gate oxide layer formed independently from the first gate oxide layer, under a bottom surface of the second gate electrode.

26. The integrated circuit of claim 25, wherein the first source region is formed in a self-aligned manner with respect to the first gate electrode.

27. The integrated circuit of claim 25, wherein the first drain region is formed in a self-aligned manner with respect to the mitigation oxide layer.

28. The integrated circuit of claim 25, wherein the channel well region is formed in a self-aligned manner with respect to the first gate electrode.

* * * * *